(12) United States Patent
Spinger et al.

(10) Patent No.: US 9,714,754 B2
(45) Date of Patent: Jul. 25, 2017

(54) LIGHTING ARRANGEMENT

(71) Applicant: PHILIPS LIGHTING HOLDING B.V., Eindhoven (NL)

(72) Inventors: Benno Spinger, Aachen (DE); Paul Scott Martin, Livermore, CA (US); Pascal Jean Henri Bloemen, Eindhoven (NL); Kuochou Tai, Fremont, CA (US)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/396,219

(22) PCT Filed: Apr. 23, 2013

(86) PCT No.: PCT/IB2013/053188
§ 371 (c)(1),
(2) Date: Oct. 22, 2014

(87) PCT Pub. No.: WO2013/160823
PCT Pub. Date: Oct. 31, 2013

(65) Prior Publication Data
US 2015/0085513 A1    Mar. 26, 2015

Related U.S. Application Data

(60) Provisional application No. 61/638,521, filed on Apr. 26, 2012.

(51) Int. Cl.
*F21K 99/00* (2016.01)
*F21S 8/10* (2006.01)
(Continued)

(52) U.S. Cl.
CPC ............... *F21V 5/045* (2013.01); *F21K 9/60* (2016.08); *F21S 48/00* (2013.01);
(Continued)

(58) Field of Classification Search
CPC ...................................................... F21V 5/045
(Continued)

(56) References Cited

U.S. PATENT DOCUMENTS 5,577,493 A * 11/1996 Parkyn, Jr. ......... G02B 19/0028
126/698
5,613,769 A * 3/1997 Parkyn, Jr. ............ F21V 7/0091
126/698
(Continued)

FOREIGN PATENT DOCUMENTS

CN    201349021 Y    11/2009
CN    102102847 A    6/2011
(Continued)

*Primary Examiner* — Jong-Suk (James) Lee
*Assistant Examiner* — Eric T Eide

(57) ABSTRACT

Lighting arrangement (1, 1') comprising a light source (2) for generating light; a spreading element (3) realized to laterally spread the generated light in a spreading plane (S), defined by an optical axis ($A_O$) of the light source (2) and a longitudinal axis (L) of the spreading element (3), to give an essentially uniform quantity of light per unit area at an emission face (41, 51) orthogonal to the spreading plane (S) and parallel to the longitudinal axis (L) of the spreading element (3) and a light redirecting element (4, 5) arranged to collect the spread light, which comprises a longitudinal planar emission face (41, 51), and is realized to collect the laterally spread light and to emit the collected light essentially uniformly from the emission face (41, 51).

11 Claims, 5 Drawing Sheets

(51) Int. Cl.
    *F21V 13/04*     (2006.01)
    *F21V 5/04*     (2006.01)
    *F21V 8/00*     (2006.01)
    *F21K 9/60*     (2016.01)
    *F21Y 115/10*     (2016.01)

(52) U.S. Cl.
    CPC ....... *F21S 48/2243* (2013.01); *F21S 48/2262* (2013.01); *F21S 48/2268* (2013.01); *F21S 48/2281* (2013.01); *F21S 48/2287* (2013.01); *F21V 13/04* (2013.01); *G02B 6/0016* (2013.01); *F21S 48/215* (2013.01); *F21Y 2115/10* (2016.08); *G02B 6/003* (2013.01); *G02B 6/0028* (2013.01)

(58) Field of Classification Search
    USPC ........................................................ 359/742
    See application file for complete search history.

(56) References Cited

U.S. PATENT DOCUMENTS

| | | | |
|---|---|---|---|
| 5,806,955 | A | 9/1998 | Parkyn, Jr. et al. |
| 6,371,623 | B1* | 4/2002 | Toyoda ................ G02B 6/0013 362/331 |
| 7,559,672 | B1* | 7/2009 | Parkyn ................... A47B 97/00 362/127 |
| 7,648,262 | B2* | 1/2010 | Tanaka ................. F21S 48/1154 359/720 |
| 2007/0029563 | A1 | 2/2007 | Amano et al. |
| 2009/0016057 | A1 | 1/2009 | Rinko |
| 2009/0225543 | A1 | 9/2009 | Jacobson et al. |
| 2009/0296211 | A1* | 12/2009 | Schubert .................. G02B 3/08 359/457 |
| 2011/0007505 | A1* | 1/2011 | Wang ..................... F21S 8/086 362/235 |
| 2011/0101397 | A1 | 5/2011 | Yuh et al. |
| 2011/0228528 | A1 | 9/2011 | Yang et al. |
| 2012/0075870 | A1* | 3/2012 | Kayanuma ................ F21V 5/04 362/311.06 |

FOREIGN PATENT DOCUMENTS

| | | |
|---|---|---|
| JP | 2007048775 A | 2/2007 |
| JP | 2010515092 A | 12/2007 |
| JP | 2010015898 A | 1/2010 |
| JP | 0003172924 U | 1/2012 |
| WO | 2012005320 A1 | 1/2012 |

* cited by examiner

LIGHTING ARRANGEMENT

CROSS-REFERENCE TO PRIOR APPLICATIONS

This application is the U.S. National Phase application under 35 U.S.C. §371 of International Application No. PCT/IB2013/053188, filed on Apr. 23, 2013, which claims the benefit of U.S. Provisional Patent Application, No. 61/638,521, filed on Apr. 26, 2012. These applications are hereby incorporated by reference herein.

FIELD OF THE INVENTION

The invention describes a lighting arrangement, a lighting element, a light redirecting element, and a number of lighting units.

BACKGROUND OF THE INVENTION

With developments in light-emitting diode (LED) technology, lighting solutions that comprise LEDs instead of conventional light bulbs are becoming more popular. An LED comprises a semiconductor diode chip that emits light from an emitter surface. The emitter surface area is very small, usually in a region of only a few square millimeters, sometimes even only a few hundredths of a square millimeter. Such an LED chip can be a top-emitting device, or can emit from the top as well as from the sides. To protect the diode chip, it is usually sealed inside a protective cover, which can also act to improve light extraction. For example, a low-power LED chip inside a transparent plastic or epoxy cover for use as an indicator light of a domestic appliance is generally referred to as "packaged LED". High-power LED chips such as those used in lighting applications can be mounted directly onto a circuit board, or onto a carrier element that can be connected to a circuit board. The high-power LED chip can be encapsulated or provided with a protective cover that also serves as a filter or other optical element.

A disadvantage of an LED is that the light emitted from the small area of the LED chip is perceived as a small, bright point of light. To make the light source appear larger and less point-like, the light can be spread, for example by an encapsulating dome or a diffusing cover. However, some of the light can be lost in this way, and the overall brightness is diminished. Furthermore, to obtain a large light source for an application such as a brake light, for example, in a prior art arrangement several LED light sources must be arranged over an area corresponding to the area of the desired "light source" in order to provide the necessary luminous flux. However, when several LEDs are arranged thus, the overall impression is one of several distinct bright points of light separated by darker zones. To better achieve the impression of a single light source, such lighting arrangements require diffusers or dedicated lenses to collect, refract and re-combine the light in the desired distribution, whereby such optical elements are always associated with some degree of loss. Furthermore, failure of one of an array of light sources will result in a "hole" in the overall light arrangement.

Since an LED chip emits light according to the Lambert cosine law, the light emitted by the LED is spread essentially evenly in all directions. This is advantageous if a round or circular light source shape is desired. Here, the term "light source shape" refers to the shape of the light source as perceived by an observer, e.g. the shape of a cover of the lighting arrangement containing the LED light source. However, owing to the nature of the light emission from the LED chip, a light source shape that is not round will exhibit less bright regions towards any "corners" or extremities of the light source shape. Clearly, such an uneven light distribution over the light source shape is unfavourable and even unacceptable for certain lighting applications that require an overall even brightness. Therefore, to obtain a light source shape that is not "round", the light emitted by an LED chip or packaged LED must be manipulated, for example by a system of collectors, reflectors or light guides in order to obtain the light distribution. However, these manipulations result in losses and in a reduction of the overall light output, so that such arrangements are unfavourably inefficient. Also, these arrangements are complicated, bulky and expensive.

Therefore, it is an object of the invention to provide an improved lighting arrangement that overcomes the problems mentioned above.

SUMMARY OF THE INVENTION

According to the invention, a lighting arrangement comprises a light source for generating light; a spreading element realised to laterally spread at least a portion of the generated light in a spreading plane, which spreading plane is defined by an optical axis of the light source and a longitudinal axis of the spreading element, to give an essentially uniform quantity of light per unit area at a collecting plane orthogonal to the spreading plane and parallel to the longitudinal axis of the spreading element and a light redirecting element arranged in the collecting plane, which light redirecting element comprises a longitudinal planar emission face, and is realised to collect the laterally spread light and to emit the collected light essentially uniformly from the emission face, which is to be understood to mean that the manner in which the light is emitted from the emission face is essentially the same for any point on the emission face.

An advantage of the lighting arrangement according to the invention is that it provides a uniform longitudinal light source without any significant loss of light. The light emitted by the light source which can be a point-like light source is initially spread essentially only in the spreading plane, so that none of the light is "wasted" in regions that do not contribute to the overall light source appearance. Furthermore, the lighting arrangement is realised such that the light is spread to give an essentially uniform quantity of light per unit area at the collecting plane. This means that at any region of the collecting plane, whether at a central region or an outer region, the light per unit area is the same. The spread light is then "captured" in the collecting plane by the light redirecting element, which acts to direct the light outward towards an observer, giving the appearance of a longitudinal light source with a favourably even or uniform appearance, i.e. with a favourably uniform light distribution over the entire longitudinal planar emission face. The expression "spreading plane" is to be understood as the plane in which the emitted light is largely confined by the optical characteristics of the spreading element. Since the spreading element has a certain width, the spreading plane may be regarded as a spatial "slice" through which the spread light is caused to travel. Here, the optical axis of the light source is to be understood as the main direction of emission of light from the light source.

The lighting arrangement according to the invention delivers a uniform distribution of light over its emission surface, which may therefore be referred to as an "apparent light source" in the following, since an observer will only see a uniformly emitting surface. This is in contrast to prior art lighting arrangements in which the observer sees a brighter central region and darker outer regions.

According to the invention, a lighting element, in particular a lighting element for use in such a lighting arrangement, comprises a light source for generating light; and a spreading element, which spreading element is realised to laterally spread at least a portion of the generated light in a spreading plane, defined by an optical axis of the light source and a longitudinal axis of the spreading element, to give an essentially uniform quantity of light per unit area at a collecting plane orthogonal to the spreading plane and parallel to the longitudinal axis of the spreading element.

An advantage of the lighting element according to the invention is that it can be realised in a very compact manner, since the spreading element can be arranged very close to the light source. No additional reflecting or collecting elements are needed to direct the light into any outer regions of the collecting plane, since this effect can be achieved entirely by the lighting element itself. Furthermore, the light spread over the collecting plane exhibits a favourable uniform quantity of light per unit area, making such a lighting element particularly suited for use in applications that require a non-circular light source shape with even or uniform light distribution.

According to the invention, a light redirecting element, realised for use in such a lighting arrangement, comprises a longitudinal planar emission face and is realised to collect laterally spread light, which laterally spread light originates from a spreading element of the lighting arrangement, and to emit the collected light essentially uniformly over the longitudinal planar emission face.

An advantage of the light redirecting element according to the invention is that it can be placed in the collecting plane of a lighting arrangement of the type described above, to optimally collect the spread light and to direct it outward towards an observer, giving the appearance of a longitudinal light source with a favourably even or uniform appearance.

According to the invention, a lighting unit can comprise an automotive lighting unit, a display lighting unit, a retro-fit lighting unit, etc., whereby each type of lighting unit comprises one or more lighting arrangements according to the invention, realised and/or dimensioned according to any relevant requirements of the lighting unit. Examples of such lighting units will be given in the description below.

The dependent claims and the following description disclose particularly advantageous embodiments and features of the invention. Features of the embodiments may be combined as appropriate. Features described in the context of one claim category can apply equally to another claim category.

The lighting arrangement according to the invention can be used in conjunction with any suitable light source. A light source that is compact and emits essentially outward from an emitting surface can be favourably used in the lighting arrangement, since all the light emitted from such a light source is emitted above that emitting surface. In a particularly preferred embodiment of the invention, therefore, the light source comprises a light-emitting diode, preferably a single light-emitting diode chip. The choice of chip can depend on the desired luminance at the planar emission face of the lighting arrangement. For example, for an automotive stop light application with a relatively large light source shape, covering several square centimeters, an LED chip with 1 $mm^2$ and 3 watt may be preferable, whereas for a small indicator light of a domestic appliance, an LED chip with 0.04 $mm^2$ and 0.1 watt can be sufficient.

The dimensions of the longitudinal planar emission face are preferably chosen to complement the dimensions of the spreading element and its spreading plane. Therefore, in a particularly preferred embodiment of the invention, a length of the emission face exceeds a width of the emission face by a factor of at least 3, more preferably by a factor of at least 6; most preferably by a factor of at least 10, i.e. the aspect ratio of the emission face is at least 1:3, more preferably at least 1:6, most preferably at least 1:10. The planar emission face therefore provides a light source shape that is favourably long and narrow, making the lighting arrangement particularly suitable for lighting applications that require a long, narrow and uniform light source shape.

Preferably, the spreading element is formed in one piece using a transparent material such as an epoxy resin, plastic, glass, etc. Preferably, such a material has a high degree of visible transmittance. To obtain the desired distribution of light in the spreading plane, the shape of the spreading element can be chosen accordingly. In a particularly preferred embodiment of the invention, the spreading element comprises two distinct lobes arranged along a longitudinal axis of the spreading element and is arranged to accommodate the light source essentially symmetrically between the two lobes, i.e. the light source is preferably arranged symmetrically about a plane that bisects the spreading element. This arrangement can have the appearance of a two-lobed peanut. In a symmetrical design, each lobe can deflect the same amount of light outward in a longitudinal direction away from the light source. The thickness, length and height of the diametrically opposing lobes can be chosen according to a desired radiation angle pattern, i.e. according to "how far" the light should be deflected in the longitudinal direction away from the light source. Preferably, the "peanut" or spreading element is realised at the same time to encapsulate an LED chip as a packaged lighting element. To this end, the "peanut" can be manufactured in one piece to also fit tightly over a carrier element onto which the LED chip is mounted.

The spreading element itself can provide a favourable spreading effect for a light source such as a top-emitting LED chip. LED chips that also emit to the side are also available. Therefore, in a particularly preferred embodiment of the invention, the lighting element comprises a receptacle for containing the light source, which receptacle comprises a reflective outer surface, and wherein the receptacle and the spreading element are realised to obtain a light output distribution comprising a first lateral spread portion in a first half of the spreading plane to one side of the optical axis, and a second lateral spread portion in the other half of the spreading plane, wherein a lateral spread portion of the radiation angle pattern is bounded by a first angle subtended from the optical axis and a second angle subtended from the optical axis. The receptacle or "cup" is specifically shaped and finished to guide any light emitted from the sides of the LED chip outward to obtain the desired radiation angle pattern. Preferably, the receptacle or cup is shaped as a recess with one or more sloping faces, arranged according to the arrangement of lobes. For example, a receptacle with an essentially rectangular perimeter can comprise a sloping face on each side of a square or rectangular LED chip. Such a receptacle can comprise a long or "major" sloping face with a shallow inclination that extends some distance under a lobe of the spreading element. The receptacle can also comprise a "minor" sloping face on each of the two remaining sides of the LED chip, preferably with a steep inclination. Alternatively, a receptacle with an essentially rectangular perimeter can comprise two long "major" sloping faces as described above, while the remaining two sides are essentially vertical. Such a combination of long, shallowly inclined receptacle surfaces and short, steeply inclined side faces, together with the light-refracting function of the "peanut", can achieve the desired wide and simultaneously narrow spreading plane or spreading "slice". The angle of a major sloping face is preferably chosen according to the desired spreading effect. Evidently, a flatter angle will result in a more lateral spreading of the light in the spreading plane, and a correspondingly "longer" aspect ratio, whereas a steeper angle will result in a more compact spreading of the light in the spreading plane, and a correspondingly "shorter" aspect ratio.

Preferably, the spreading element, with or without a receptacle as described above, is realised to spread the greater portion of the light in a lateral spread portion between a first angle subtended from the optical axis and a second angle subtended from the optical axis. Preferably, the lateral spread portion is obtained by a suitable combination of a first angle comprising at least 35°, more preferably at least 45°, most preferably at least 55° subtended from the optical axis; and a second angle exceeding the first angle by at most 25°, preferably by at most 20°, most preferably by at most 15°, whereby the first and second angles are chosen such that a lateral spread portion with a desired span is obtained. In other words, the greater portion of the light is emitted into the spreading plane in an angular region given by a suitable combination of a first angle of 45°±10° and a second angle of 67.5°±12.5°, so that a favourably "lateral" or "wing-like" light distribution is achieved within the spreading plane.

For example, such an angular region can be bounded by a first angle of 35° and a second angle of 55°; by a first angle of 50° and a second angle of 75°; by a first angle of 55° and a second angle of 85°; etc. The choice of the first and second angles can depend on a desired aspect ratio of the longitudinal planar emission face of the light redirecting element. For example, an aspect ratio of about 1:3 can be obtained by an angular region defined by a first angle of 35° and a second angle of 55°, while an aspect ratio of about 1:12 could be obtained by an angular region defined by a first angle of 55° and a second angle of 85°.

The remainder of the light emitted by the light source is spread, in the spreading plane, beyond the lateral spread portions bounded by the first and second angles on each side of the "peanut". For example, a relatively minor fraction of the light is spread in a central angular region defined by the first angle on either side of the optical axis between the lateral spread portions. Another minor portion of the light can be spread in the angular region "below" the lateral spread portion on each side of the "peanut".

Since the light is spread on both sides of the "peanut", this light distribution or radiation angle pattern has the appearance of a "batwing", as will be shown in the description of the drawings. The "batwing" distribution between these angles in the spreading plane ensures an essentially uniform quantity of light per unit area at the collecting plane. In another preferred embodiment of the invention, the lighting element is realised to spread the light in the spreading plane such that losses in the light redirecting element may be compensated for. For example, light in the outer reaches of the spreading plane will need to be bent or manipulated by the light redirecting element, to a greater extent than, for example, light that is emitted closer to the optical axis, which undergoes less bending or manipulating as it passes through the light redirecting element. The secondary losses occurring during light transmission through the outer ends of the light redirecting element are preferably compensated for in advance by realising the lighting element to direct more light into the relevant outer reaches of the spreading plane. For example, for a lighting element intended to emit the greater portion of its light into angular regions between 65° and 75° on each side of its optical axis, the "peanut" and/or the reflective cup of the lighting element can be shaped to direct additional light into the region bounded by 73.5° and 75°. In this way, a favourably homogenous light distribution can be achieved all along the longitudinal planar emission face of the light redirecting element.

The light in the spreading plane is collected by a light redirecting element relatively close to the lighting element, so that the spread light is collected at a level in which the spread light can provide the appearance of a rectangular or longitudinal "light source" of the desired dimensions. To this end, the light redirecting element can be positioned directly above the spreading element, at a slight distance from the spreading element, or at a greater distance from the spreading element, depending on the desired effect.

The light redirecting element can be manufactured according to the desired optical effect of the light direction. In one exemplary preferred embodiment of the lighting arrangement according to the invention, the light redirecting element is realised to emit the collected light with uniform luminance. To this end, the light redirecting element is preferably dimensioned according to light distribution in the spreading plane and preferably comprises a diffusion layer such as a phosphor layer. For example, the light redirecting element can comprises a relatively long rectangular strip that comprises a phosphor layer. The phosphor layer can be a phosphor coating applied to the outer surface of the rectangular strip, or can be arranged in the rectangular strip in a sandwich manner, as appropriate. Such a light redirecting element can be useful for a lighting application in which the appearance of a rectangular light source is desired, from which the light is emitted isotropically, i.e. uniformly in all directions, for example according to the Lambert cosine law. An example of such a lighting application might be a display illumination arrangement comprising a display plate with a number of in-coupling faces arranged around a perimeter of the display plate; and a number of lighting arrangements according to the invention, with such phosphor-coated light redirecting element arranged such that the outer surface of the light redirecting element is directed at an in-coupling face of the display plate. Another application might be a retro-fit lighting unit comprising a housing realised to correspond to the dimensions of a conventional fluorescent lighting unit, and a number of lighting arrangements, each with such a phosphor-coated light redirecting element, arranged in a row within the housing. Viewed from outside the housing, the retro-fit lighting unit gives the appearance of a uniform light source similar to a conventional fluorescent tube, but is more economical since it consumes less power per lumen. Another advantage of such a lighting application is that an existing lighting fitting could be left in place and used again by simply replacing the conventional fluorescent tube by a glass tube containing the lighting arrangements according to the invention, and any driving arrangement required to convert a mains power supply to a level suitable for use with the LED chips of the lighting arrangements.

Other lighting applications may require that the light is directed in essentially only one direction from the emission face of the light redirecting element. Therefore, in a particularly preferred embodiment of the invention, the light redirecting element comprises a plurality of distinct lateral refracting zones for collecting and refracting the laterally spread light in an emission plane, wherein the emission plane comprises a continuation of the spreading plane. Each lateral refracting zone can be realised to collect and refract a portion of the laterally spread light. The light redirecting element can also be realised to direct some portion of the light into the emission plane via total internal reflection. Preferably, the light redirecting element is realised as a Fresnel lens, in which each distinct lateral refracting zone comprises a collecting face arranged to collect a light portion having a certain incidence angle range, and a refracting body for refracting the light portion through the emission face and essentially parallel to the optical axis. Preferably, the collecting face and/or the refracting body of a distinct lateral refracting zone are dimensioned according to the fraction of the laterally spread light directed at that distinct lateral refracting zone. Therefore, the light redirecting element can comprise an arrangement of smaller and larger distinct lateral refracting zones, whereby the size of a lateral refracting zone depends on its position in the light redirecting element. The number of distinct lateral refracting zones can be chosen according to the size of the spreading element and/or the size of the desired longitudinal apparent light source. Furthermore, the number of distinct lateral refracting zones can be determined on the basis of a desired degree or level of homogeneity of the output light.

Preferably, the light redirecting element comprises a central refracting zone arranged about the optical axis of the lighting arrangement, coinciding with the optical axis of the light source, which central refracting zone is arranged to collect and refract a central light bundle originating from a central region of the spreading element, i.e. from the region between the two lobes of the "peanut".

Such a realisation of the light redirecting element can be suitable for lighting applications in which the light is usually only seen from directly in front of the light source, i.e. by an observer looking essentially directly at the emission face of the lighting arrangement. For example, the lighting arrangement according to the invention, with such a Fresnel realisation of the light redirecting element, can be put to good effect in an automotive lighting unit such as a combined stop/tail light or a Centre High Mount Stop Lamp (CHMSL). Such an automotive lighting unit according to the invention comprises a lighting arrangement in which the longitudinal planar emission face comprises a rectangular output surface of a Fresnel light redirecting element as described above. In this way, an effective and reliable lighting arrangement with a uniform apparent light source with the desired dimensions can be achieved with a single LED chip. Such an effect cannot be achieved by the prior art lighting arrangements that require several LEDs in a row in an attempt at achieving a "long" light source, since those individual or separate light sources can be clearly distinguished in such arrangements. Of course, the lighting arrangement according to the invention can be used for any application requiring a long, uniformly lit apparent light source, for example an interior panel indicator light in the cockpit of any type of vehicle, a domestic appliance, display panel lighting, etc.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
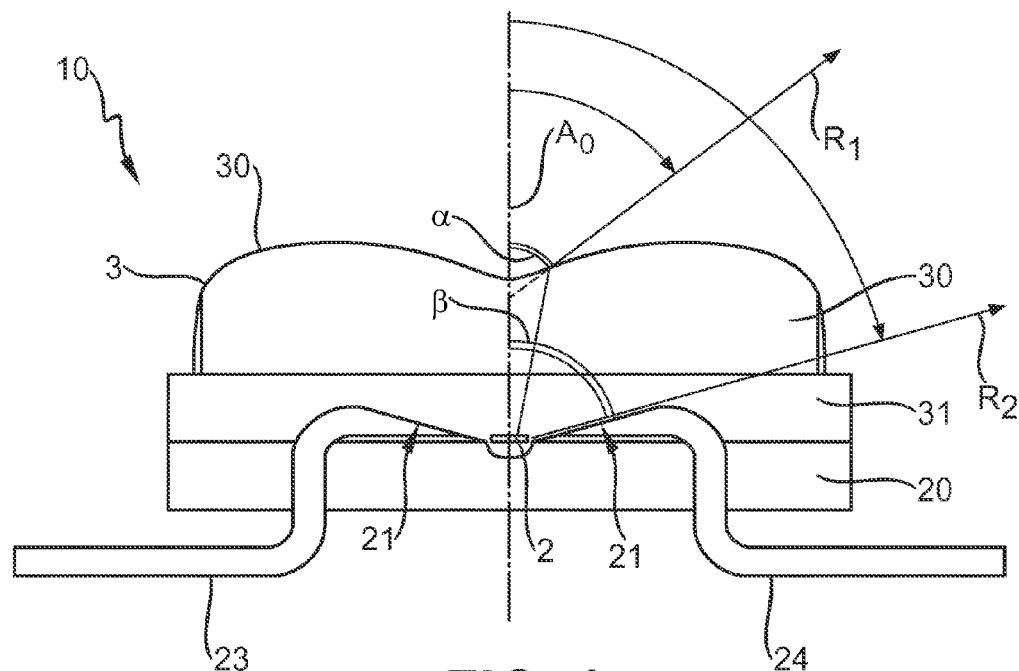
FIG. 1 shows a lighting element according to an embodiment of the invention.

FIG. 1 shows a schematic cross section through a lighting element 10 according to an embodiment of the invention. This exemplary embodiment of the lighting element 10 comprises an LED chip 2 arranged between contacts 23, 24 in a type of SnapLED construction. An encapsulating spreading element 3 comprises two distinct lobes 30 and a cover part 31, and is arranged over a carrier or heat sink 20 to seal in the LED chip 2. The LED chip 2 is placed centrally relative to the spreading element 3, so that these both share a common optical axis $A_O$. The interior ends of the contacts 23, 24 are shaped to form a receptacle 21 or "cup" 21 in which the LED chip is positioned. The upper surfaces of the receptacle 21 are reflective, for example by means of polishing or by applying a reflective coating. The receptacle 21 and the lobes 30 of the spreading element 3 act to direct the generated light predominantly outward as shown by the exemplary bounding light rays $R_1$ and $R_2$ at the right of the diagram, defining the lateral spread portion on that side of the spreading element 3. The upper light ray $R_1$ subtends a first angle $\alpha$ from the optical axis $A_O$, while the second ray $R_2$ subtends a second angle $\beta$ from the optical axis $A_O$.

Figure 2:
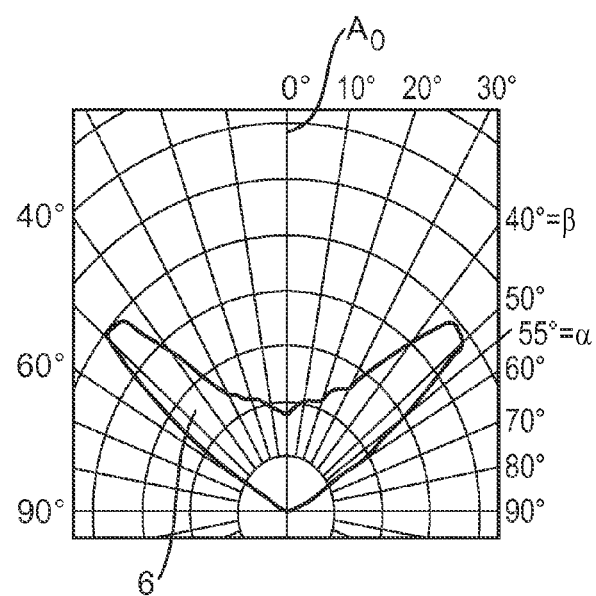
FIG. 2 shows a polar grid with a radiation characteristic of the lighting element of FIG. 1.

FIG. 2 shows a polar grid with a radiation characteristic 6 of the lighting element 10 of FIG. 1. As the diagram clearly shows, the radiation characteristic 6 has two distinct side portions or "wings" directed away from the centre, i.e. away from the light source. Most of the light is directed outward into these side portions. The radiation characteristic 6 effectively has a "batwing" appearance, since the light is directed into the spreading plane such that essentially all the light is directed into these zones. A lateral zone is bounded by the first angle $\alpha$ and the second angle $\beta$ subtended from the optical axis $A_O$, whereby the first angle $\alpha$ comprises about 40° and the second angle $\beta$ comprises about 55°.

Figure 3:
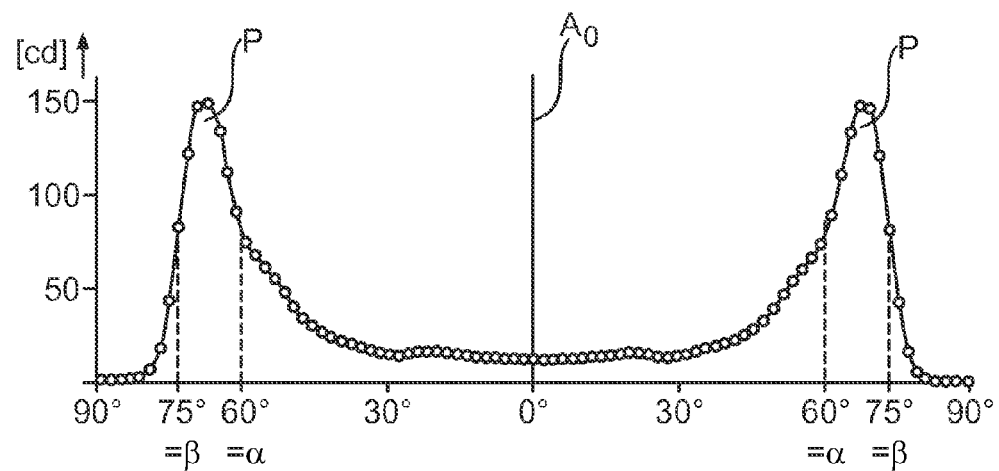
FIG. 3 shows a rendering of the light output by an embodiment of the lighting element of FIG. 1.

FIG. 3 shows another rendering of the light output by an embodiment of the lighting element 10 of FIG. 1, given in candelas [cd] against degrees [O] measured radially about the lighting element 10, commencing at a point on the optical axis $A_O$ at 0° and terminating at a point at 90° from the optical axis $A_O$. The diagram clearly indicates a peak P in light intensity on each side of the optical axis $A_O$. For this light distribution, a spreading element and/or a receptacle has been realised to obtain a peak P on each side of the optical axis between first and second angles α, β of about 60° and 75° respectively. This light distribution is suitable for a light redirecting element with a rectangular outer face having an aspect ratio of about 1:6.

Figure 4:
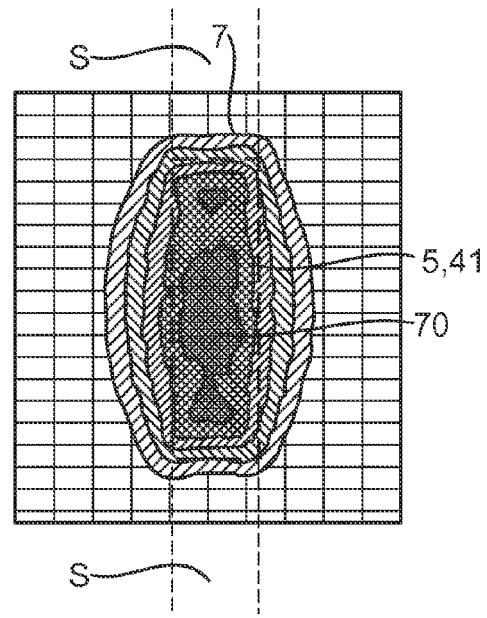
FIG. 4 shows a schematic representation of a light distribution generated by the lighting element of FIG. 1.

FIG. 4 shows a schematic representation of a light distribution 7 generated by the lighting element 10 of FIG. 1. The spreading plane S is indicated by the "slice" S between the dotted lines. The plane of the diagram can be understood to correspond to a collecting plane of a light redirecting element such as a phosphor-coated strip, or the emission surface of a Fresnel lens as described above. The emission face 5, 41 of a light redirecting element is indicated by the dotted line. As the diagram clearly shows, the light distribution comprises a brighter, essentially rectangular central portion 70, and successive outer portions of decreasing brightness. The light redirecting element is positioned in the collecting plane to optimally collect the light in the spreading plane S and to emit it from the emission surface to give the desired rectangular apparent light source.

Figure 5:
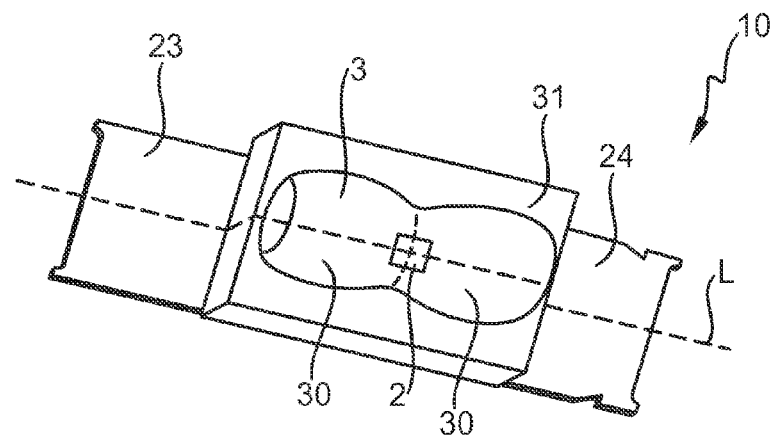
FIG. 5 shows a perspective view of the lighting element of FIG. 1.

FIG. 5 shows a perspective view of the lighting element 10 of FIG. 1. Here, the lobes 30 of the peanut-shaped spreading element 3 can clearly be seen. The lobes 30 are arranged symmetrically about the optical axis of the lighting element 10, which coincides with the optical axis of the LED chip 2 enclosed within the spreading element 3 and indicated by the dotted lines. Also, the lobes 30 are arranged symmetrically about a longitudinal axis L of the lighting element 10, which can coincide with a longitudinal axis of a light redirecting element arranged above the lighting element 10.

Figure 6:
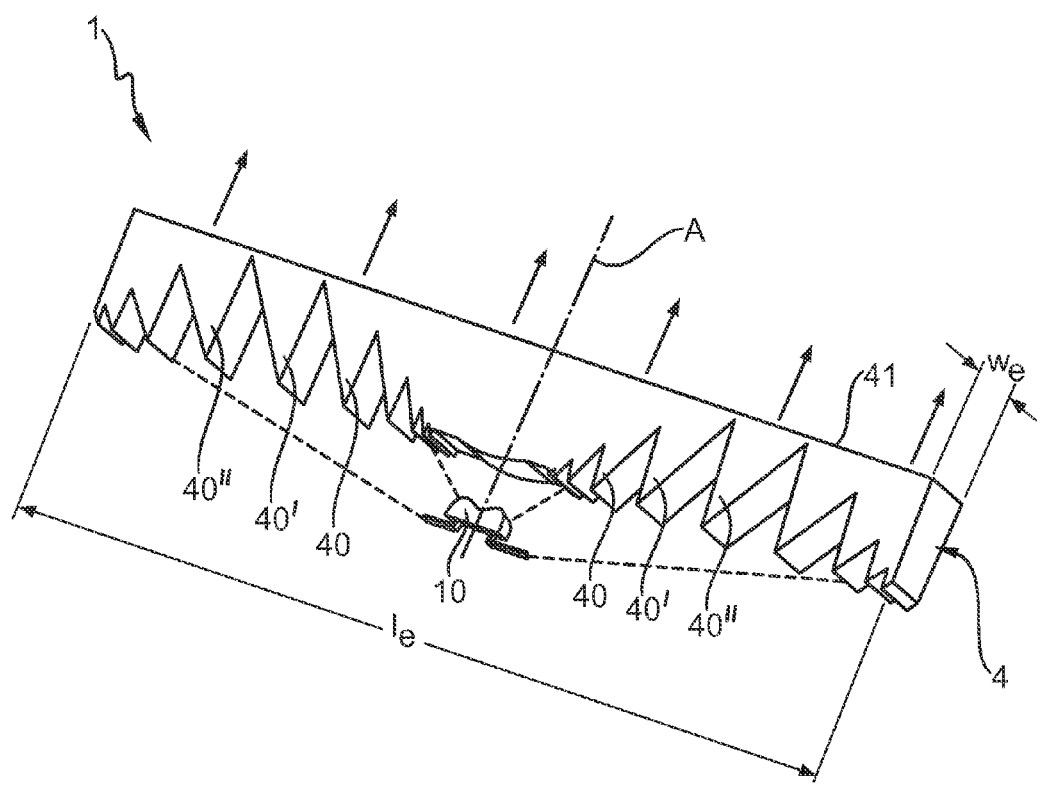
FIG. 6 shows a lighting arrangement according to a first embodiment of the invention.

FIG. 6 shows a lighting arrangement 1 according to a first embodiment of the invention. Here, the lighting element 10 is arranged below a Fresnel lens element 4, comprising a body with a plurality of lateral refracting prism elements 40, 40', 40", a central refracting portion, and an essentially rectangular emission face 41. The Fresnel lens element 4 is preferably formed in one piece, for example by an extrusion or milling process. The light emitted by the lighting element 10 is spread outward by the double-lobed spreading element such that a "batwing" characteristic is predominantly obtained, indicated here by the broken lines. The lateral refracting prism elements 40, 40', 40" are shaped to collect the light of various sectors of the "batwing" and refract the collected light essentially perpendicularly outward from the emission face 41 of the Fresnel lens 4. To an observer looking at the emission face 41, therefore, this appears as a uniform rectangular source of light with a length $l_e$ and width $w_e$, i.e. with an aspect ratio of $w_e:l_e$. Such a lighting arrangement 1 can be used to good effect in, for example, an automotive lighting application such as a brake light. It could also be used in a display application, for example to provide a longitudinal and uniform light source for directing into the sides of a display screen.

Figure 7:
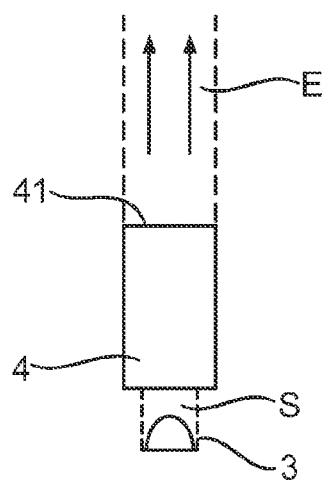
FIG. 7 shows a schematic side view of the lighting arrangement 1 of FIG. 5

FIG. 7 shows a schematic side view of the lighting arrangement 1 of FIG. 6. The diagram illustrates the effect of the Fresnel refracting element 4. The light in the spreading plane S (indicated by the dotted lines), originating from the spreading element 3, is collected and refracted in such a way that it is emitted essentially perpendicularly, as indicated by the vertical arrows) from the emission face 41 in an emission plane E that is essentially a continuation of the spreading plane S. Of course, a minor portion of the collected and refracted light can be emitted as scattered or stray light, but the major portion of the light is emitted in the emission plane E.

Figure 8:
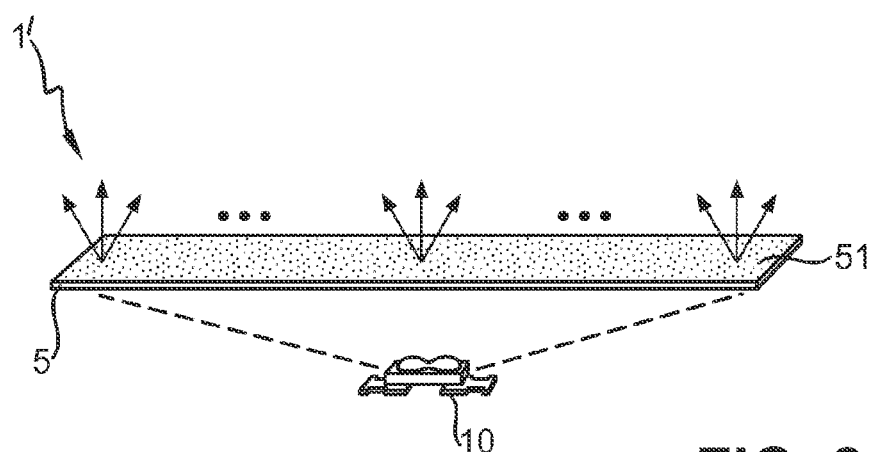
FIG. 8 shows a lighting arrangement according to a second embodiment of the invention.

FIG. 8 shows a lighting arrangement 1' according to a second embodiment of the invention. Here, the lighting element 10 is arranged below a translucent strip 5 that is coated with or otherwise treated to comprise a phosphor layer, indicated by the stippled pattern. The phosphor layer is illuminated by the batwing distribution of the light spread by the lighting element 10 when the enclosed LED is driven by a voltage across its electrodes. Since the phosphor collects the incident light and re-emits or scatters the light essentially uniformly according to the Lambert cosine law, i.e. the phosphor layer acts as an isotropic radiator, the effect of this lighting arrangement 1' is to provide an evenly "emitting" surface 5 that itself appears to act as a light source 5. The light collected and emitted by the phosphor from a point on the translucent strip 5 is indicated here by groups of light rays emitted essentially uniformly in all directions. Such a lighting arrangement 1' can be used to good effect to provide, for example, a retro-fit replacement for a fluorescent tube lamp. One or more such lighting arrangements 1' could be placed in a long row, side by side, in a glass tube of such a lamp, so that, during operation, the lighting arrangements 1' provide the appearance of an evenly illuminated "fluorescent tube".

Figure 9:
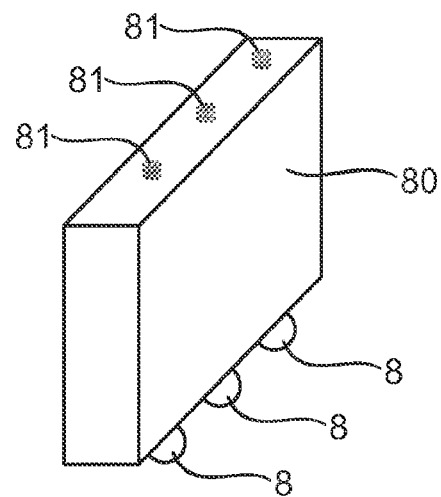
FIG. 9 shows a prior art automotive lighting unit.

FIG. 9 shows a prior art automotive lighting unit comprising a number of light sources such as conventional packaged LEDs 8 arranged below a wave guide or light guide 80. At an emission surface of the lighting unit, distinct bright areas 81 (indicated by stippling) are perceived, separated by less brightly illuminated zones (these remain white in the drawing but would in fact be darker than the bright areas 81), since the conventional lighting unit does not have any means of first spreading the light to suit the dimensions of the light guide before the light enters the light guide.

Figure 10:
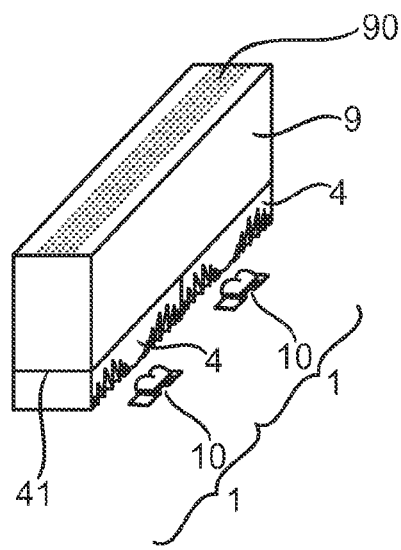
FIG. 10 shows an automotive lighting unit according to an embodiment of the invention.

FIG. 10 shows an automotive lighting unit according to an embodiment of the invention. Here, the lighting unit comprises a number of lighting arrangements 1 according to the invention, each with a lighting element 10 and a light redirecting element 4. The light redirecting elements 4 can be realized as a single entity with a single emission face 41. The light passing through the emission face 41 is favourably uniform and already directed perpendicularly upward into a light guide 9. An observer will see an image 90 of the apparent light source generated at the emission face 41. This image 90 is uniform in appearance without any noticeably brighter zones or intermediate darker zones, in contrast to the arrangement shown in FIG. 9 above.

Figure 11:
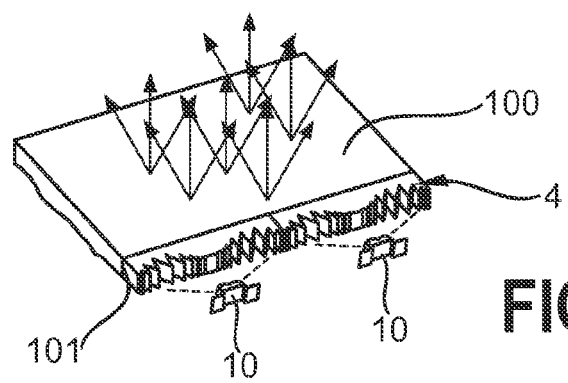
FIG. 11 shows a display illumination arrangement according to an embodiment of the invention.

FIG. 11 shows a display illumination arrangement according to an embodiment of the invention, comprising a transparent display 100 and a number of lighting arrangements 1 arranged along one or more side faces 101 of the display 100. The light directed into the display 100 serves to evenly illuminate the display surface.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:
1. A lighting arrangement, comprising:
a light source for generating light;
a spreading element configured to laterally spread the generated light in a spreading plane, defined by an optical axis of the light source and a longitudinal axis of the spreading element, to give a uniform quantity of light per unit area at a plane orthogonal to the spreading plane and parallel to the longitudinal axis of the spreading element; and a light redirecting element provided with a collecting surface to collect the laterally spread light and an emission face to emit the collected light, wherein the light redirecting element comprises a single Fresnel lens associated with the light source and is configured to emit the collected light uniformly from the emission face, the emission face is longitudinal planar and comprises a long rectangular emission face, and the collecting surface comprises a central refractive zone arranged to coincide with the optical axis of the light source and a plurality of distinct lateral refracting zones at sides of the central refractive zone for collecting the laterally spread light, wherein each of the distinct lateral refracting zones comprises a respective collecting face arranged to collect a light portion from said spreading element having a certain incidence angle range and a respective refracting body for refracting the light portion through the emission face, wherein the surface areas of at least a first subset of the collecting faces progressively increase as a distance of the collecting faces of the first subset from said light source increases along a direction and wherein the surface areas of at least a second subset of the collecting faces progressively decrease as a distance of the collecting faces of the second subset from said light source increases along said direction, wherein said second subset is disposed farther from said light source than said first subset along said direction and wherein the rate of the progressive increase is symmetrical with the rate of the progressive decrease and wherein each of the first subset of the collecting faces and the second subset of the collecting faces extend to a point and each point is positioned a same distance from the emission face.

2. The lighting arrangement according to claim 1, wherein the light source comprises a single light-emitting diode chip.

3. The lighting arrangement according to claim 1, wherein a length of the emission face exceeds a width of the emission face by a factor of at least 3.

4. A lighting element, for use in the lighting arrangement according to claim 1, comprising:
the light source for generating light; and
the spreading element, wherein the spreading element is configured to laterally spread the generated light in the spreading plane, defined by the optical axis of the light source and the longitudinal axis of the spreading element, to give a uniform quantity of light per unit area at the plane orthogonal to the spreading plane and parallel to the longitudinal axis of the spreading element.

5. The lighting element according to claim 4, wherein the spreading element comprises two distinct lobes arranged along the longitudinal axis of the spreading element, whereby the spreading element is arranged to accommodate the light source symmetrically between the two lobes.

6. The lighting element according to claim 4, comprising a receptacle for containing the light source, which receptacle comprises a reflective surface, and wherein the receptacle and the spreading element are configured to obtain a light output distribution comprising a first lateral spread portion in a first half of the spreading plane to one side of the optical axis, and a second lateral spread portion in the other half of the spreading plane, wherein a lateral spread portion of the light output distribution is bounded by a first angle subtended from the optical axis and a second angle subtended from the optical axis.

7. The lighting element according to claim 6, wherein the first angle comprises at least 35° subtended from the optical axis.

8. The lighting element according to claim 6, wherein the second angle comprises an angle exceeding the first angle by at most 25°.

9. A light redirecting element, comprising:
a collecting surface to collect light from a light source having an optical axis, and an emission face to emit the collected light,
wherein the light redirecting element comprises a single Fresnel lens associated with the light source and is configured to emit the collected light uniformly from the emission face,
wherein the emission face is longitudinal planar and comprises a long rectangular emission face, and
wherein the collecting surface comprises a central refractive zone arranged to coincide with the optical axis of the light source and a plurality of distinct lateral refracting zones at sides of the central refractive zone for collecting the light,
wherein each of the distinct lateral refracting zones comprises a respective collecting face arranged to collect a light portion having a certain incidence angle range and a respective refracting body for refracting the light portion through the emission face,
wherein the surface areas of at least a first subset of the collecting faces progressively increase as a distance of the collecting faces of the first subset from said light source increases along a direction and wherein the surface areas of at least a second subset of the collecting faces progressively decrease as a distance of the collecting faces of the second subset from said light source increases along said direction, and wherein each of the first subset of the collecting faces and the second subset of the collecting faces extend to a point and each point is positioned a same distance from the emission face,
wherein said second subset is disposed farther from said light source than said first subset along said direction and wherein the rate of the progressive increase is symmetrical with the rate of the progressive decrease.

10. The light redirecting element according to claim 9, wherein the light redirecting element is configured to refract the collected light into an emission plane, wherein the emission plane comprises a continuation of the spreading plane.

11. A display illumination arrangement, comprising:
a display plate with a number of in-coupling faces arranged around a perimeter of the display plate; and
a number of lighting arrangements according to claim 1, arranged such that the emission face of a lighting arrangement is directed at an in-coupling face of the display plate.

* * * * *